(12) United States Patent
Gloo et al.

(10) Patent No.: US 10,038,958 B1
(45) Date of Patent: Jul. 31, 2018

(54) TAPE CAST MULTILAYER SONAR TRANSDUCER

(71) Applicant: Lockheed Martin Corporation, Bethesda, MD (US)

(72) Inventors: Todd C. Gloo, Liverpool, NY (US); James D. Weigner, Clay, NY (US); Raymond Porzio, LaFayette, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 419 days.

(21) Appl. No.: 14/746,149

(22) Filed: Jun. 22, 2015

Related U.S. Application Data

(62) Division of application No. 12/977,537, filed on Dec. 23, 2010, now Pat. No. 9,070,880.

(51) Int. Cl.
*H01L 41/08* (2006.01)
*H04R 17/00* (2006.01)
*H01L 41/083* (2006.01)

(52) U.S. Cl.
CPC ............ *H04R 17/00* (2013.01); *H01L 41/083* (2013.01)

(58) Field of Classification Search
CPC ............... H01L 41/047; H01L 41/0472; H01L 41/0475; H01L 41/083
USPC ............................................. 310/323.12, 328
See application file for complete search history.

(56) References Cited

U.S. PATENT DOCUMENTS

| | | | |
|---|---|---|---|
| 5,089,739 A | 2/1992 | Takahashi et al. | |
| 5,208,506 A * | 5/1993 | Yamashita | ............ H01L 41/053 310/328 |
| 5,237,239 A | 8/1993 | Inoue et al. | |
| 6,467,140 B2 | 10/2002 | Gururaja | |
| 6,573,639 B1 | 6/2003 | Heinz et al. | |
| 6,620,752 B2 | 9/2003 | Messing et al. | |
| 2003/0107301 A1* | 6/2003 | Asano | ................... H01L 41/083 310/328 |
| 2004/0169438 A1* | 9/2004 | Cramer | ................. H01L 41/083 310/328 |
| 2006/0163974 A1 | 7/2006 | Park et al. | |
| 2006/0232172 A1* | 10/2006 | Asano | ................. H01L 41/0472 310/366 |

FOREIGN PATENT DOCUMENTS

JP             63136677 A      6/1988

\* cited by examiner

*Primary Examiner* — Derek Rosenau
(74) *Attorney, Agent, or Firm* — Howard IP Law Group

(57) ABSTRACT

A tape cast transducer element assembly comprises a tape cast transducer element including a multi-layer piezoelectric stack diced from a sintered piezoelectric body formed from a plurality of thin film tape layers, the film thin tape layers sintered to produce a final density. A conductive film coats select ones of the thin film tape layers such that conductive layers of different polarities are exposed on opposing sides of the multi-layer piezoelectric stack. Electrodes are coupled to the conductive layers. Electrical leads are coupled to each electrode. A head mass is configured to encapsulate a top portion of the stack. A tail mass is configured to encapsulate a bottom portion of the stack. At least one coupling arrangement extends from a top surface of the head mass through the cross-sectional area of the head mass into the tail mass such that the stack is contained in a rigid assembly under compression.

20 Claims, 10 Drawing Sheets

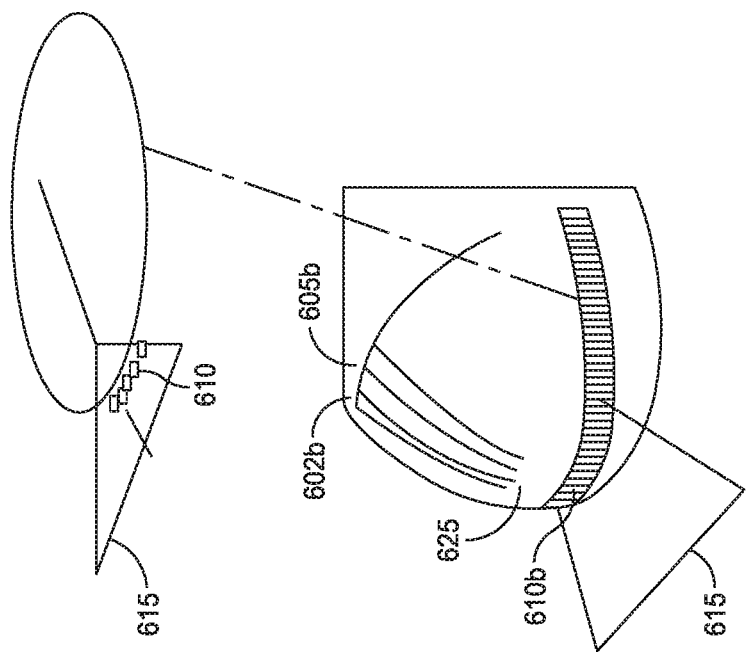
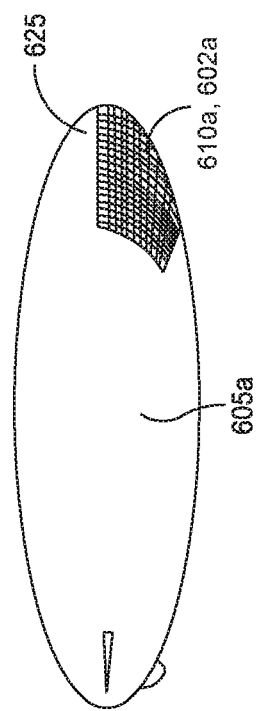

TAPE CAST MULTILAYER SONAR TRANSDUCER

CROSS REFERENCE TO RELATED APPLICATIONS

This application is a divisional of U.S. patent application Ser. No. 12/977,537, filed on Dec. 23, 2010 entitled, METHOD OF MANUFACTURING A TAPE CAST MULTILAYER SONAR TRANSDUCER, the subject matter of which is incorporated by reference herein in its entirety.

FIELD OF THE INVENTION

The present invention relates to sonar transducers and more particularly, to tape cast multi-layer piezoelectric stack transducer elements.

BACKGROUND OF THE INVENTION

Naval architects and electronic warfare designers have expressed interest in large area conformal sonar arrays for applications where the transducers are electronically scanned to transmit and receive acoustic beams. These arrays would require thousands of transducers each separately mounted in a plane, but until now constructing an array in this fashion would result in high production and maintenance costs, large mounting areas and an unreliable design. As such, except in a very limited sense, larger transmitting/receiving arrays such as those found in phased array radar antenna technology generally or in conformal antennae technology particularly, have not been possible for sonar applications. However, conformal acoustic arrays hold extraordinary possibilities for undersea sonar applications such as 3-dimensional mapping, mine hunting and mine avoidance.

Large-scale array technology needs to solve several key problems before undersea operations can exploit its potential. The prior art includes arrays such as the bow array having transducers numbering in the hundreds and assembled using conventional technology. Bow arrays in cylindrical form are appendages to a ship and are incapable of a fully streamlined integration into a hull design. Also, to conserve space and to minimize hull penetrations, the drive, and receive circuitry of large arrays have had to be co-located in proximity to the transducers and outside the vessel's hull, requiring low voltages yet very high electric fields to exploit advanced transduction materials. Furthermore, array elements would have to be nearly identical in their input impedance characteristics in that the sheer numbers of elements contemplated would not permit individualized transformers/tuning circuits.

The curvature of the hull surface, to which a conforming array would be mounted, typically presents the designer with challenges due to dimensional instability and size. For example, expansion and contraction of such an array under environmental influences changes element-to-element separation. These types of problems tend to degrade the shape, gain, and sidelobes of electronically scanned beams. Accurate beamforming and shaping is therefore difficult to achieve because a ship's surface expands and contracts significantly due to density and temperature variations and tends to flex under the force of required maneuvering.

Sonar systems widely employ transmitting and receiving transducers utilizing a tonpilz configuration. These devices have a tail mass at a proximal end and a head mass at a distal end. Between these two ends piezoelectric ceramic element drivers extend longitudinally between and in physical contact with the head mass and the tail mass. A tie rod maintains the stack of drivers under a compressive stress. Excitation of the drivers at a frequency of resonance causes the head and tail masses to oscillate at a longitudinal frequency to provide a sonar signal.

Conventional tonpilz configuration technology has not been sufficiently adaptable to large-scale array applications, at least in part because conventional manufacturing processes make it difficult to control the input impedance that in some instances requires individualized transformers/tuning circuits. Further, the technology does not facilitate close electrode coupling due at least in part to the use of cemented joints between piezoelectric elements. Finally, requirements for electrode foils, cementing, and soldering when applied to the thousands of transducers required for one array, make the conventional technology impractical for many applications such as conformal transducer array applications.

SUMMARY

One embodiment is a tape cast ceramic one-piece multilayer piezoelectric stack utilized as a sonar transducer element driver.

According to yet another aspect, a tape cast ceramic sonar transducer array conforms to the shape of a ship hull and has multiple tape cast panels, each capable of operating as an electronically scanned sonar, and each capable of independently forming, steering, and shaping transmit and receive beams without the need for individualized tuning circuits. A signal switching distribution network allows transmit power and requisite sonar and control signals to be sent to and received from selected transducers or subsets of the panels. A processor coherently combines the return signals received from selected transducers or subsets of the panels for a wide range of undersea applications. The tape cast ceramic sonar transducer array provides a low voltage, yet very high electric field for high-power transduction in conformal array applications, for example on a ship's hull, which require low voltage outboard electronics. Advanced high-power drive materials, for example, Lead Magnesium Niobate, may be exploited by producing high electric field biasing and drive fields at low voltages.

BRIEF DESCRIPTION OF THE DRAWINGS

Objects and advantages of the subject matter of this application will be apparent upon consideration of the following detailed description, taken in conjunction with accompanying drawings, in which like reference characters refer to like parts throughout, and in which:

FIG. 6A illustrates a conformal mounting of a sonar array on a doubly-curved surface of a ship according to an exemplary embodiment;

FIG. 6B illustrates a conformal mounting of a sonar array on a singly-curved surface of a ship according to an exemplary embodiment;

DETAILED DESCRIPTION

Figure 1:
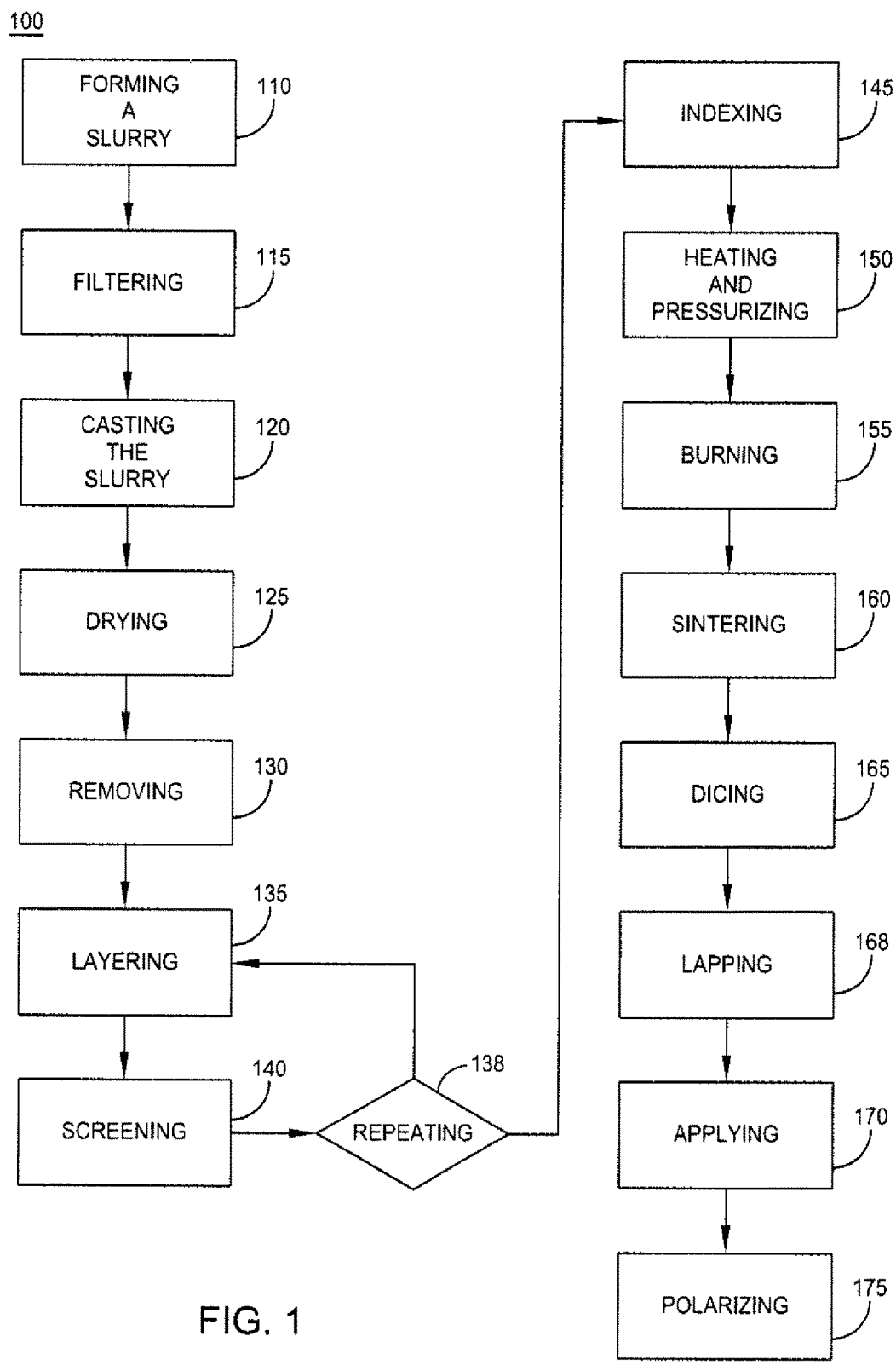
FIG. 1 is a process flow for producing a tape cast, one-piece multi-layered piezoelectric stack according to an exemplary embodiment.

FIG. 1 shows one embodiment of the inventive process 100 for making a one-piece multi-layer piezoelectric stack by forming a slurry 110 by mixing finely controlled piezoelectric ceramic powder, a solvent and binders. The second step requires filtering the slurry 115, de-airing the mixture and then casting 120 a piezoelectric body several inches wide onto a moving substrate carrier producing a ceramic material having a thickness in a range of 0.002-0.020 inches. The piezoelectric material may comprise a PZT ceramic film, by way of example. The ceramic coated substrate carrier traverses through a low temperature oven, (e.g., typical range of 125-225 degree F.). Through a process of drying 125, the volatile organic materials are evaporated or burned off. When the film drying 125 is complete removing 130 the tape strips it from the substrate carrier. Layering 135 stacks the film atop one another. After layering 135 creates a specified stack thickness, selected layers have electrodes applied by screening 140 a pattern of conductive noble material such as silver, gold alloy or a platinum ink onto the desired layer. In one non-limiting embodiment one pattern produces a conductive film over a portion of a contiguous plane surface that covers three of the four edges of one layer. The pattern is alternately flipped about the vertical axis of a stack to produce a conductive coating representing corresponding alternate polarities. Repeating 138 the process of stacking layers by layering 135 strips of tape atop one another results in a final desired stack thickness. Indexing 145 the electrode pattern exposes the desired polarity, after dicing 165 the body into separate stacks. Heating (e.g., 150-300 degrees F. (Fahrenheit)) and pressurizing (1,000-5,000 p.s.i.) 150 the stack-up of layers consolidates them to form a contiguous body with an internal pattern of electrodes. Burning at 800-1500 degrees F. 155 removes the binder and sintering at 2102 to 2417 degrees F. 160 produces a final density and desired mechanical strength. Dicing 165 the solid body using a precision dicing saw produces individualized sonar transducer tape cast stacks. The process of dicing 165 marginally exposes the desired electrode polarities on two of the four sides of the stack. Lapping 168 individual stacks clearly exposes the desired electrodes. Applying 170 a strip of fired silver soldered wire, silver termination ink or conductive epoxy connects the electrodes of like polarity (positive on one side and negative on the other) to wire the transducer element stack. Polarizing of the piezoelectric element 175 is performed at 212-257 degrees F. under 50-80 volts per thousandth of an inch of ceramic thickness between electrode layers.

In production, the process 100 has the ability to generate hundreds or thousands of individualized finished stacks each requiring very little labor. Furthermore, each may be produced at a cost of approximately one tenth of the cost of producing a conventional stack. Once assembled, the stacks provide approximately a 10%-15% improvement in electromechanical coupling efficiency over a conventional stacked element transducer due at least in part to the absence of cement joints. Furthermore, the stacks have nearly identical impedance with respect to the neighboring stacks without the need for individualized tuning circuits.

Figure 2:
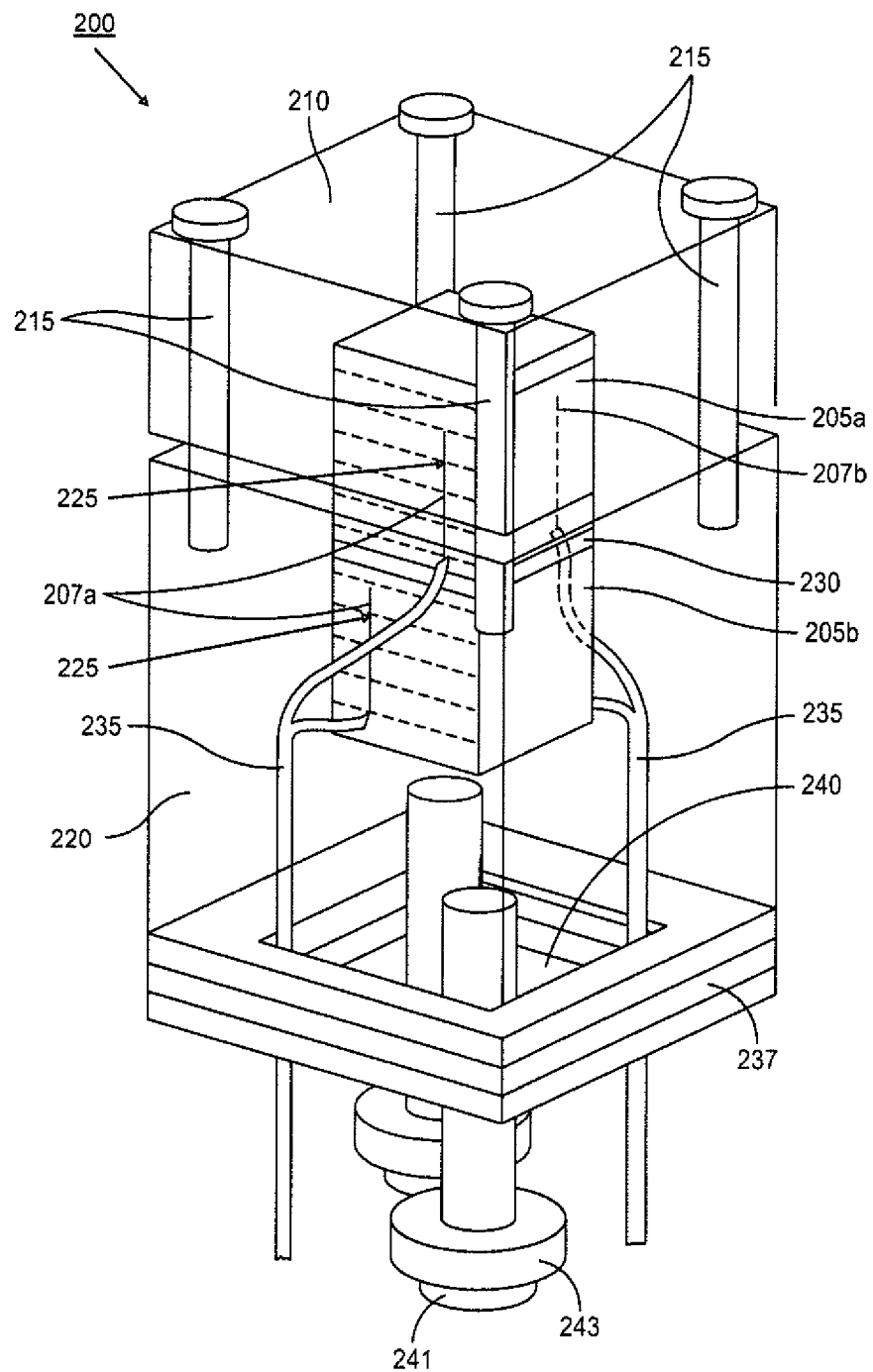
FIG. 2 is a semi-transparent isometric view showing a tape cast transducer element according to an exemplary embodiment.

FIG. 2 shows finished tape cast stacks such as 205a and 205b and not the individual layers of tape. The tape cast stacks 205a and 205b, are placed into a sonar transducer element assembly 200, each separated by insulating layer 230. Each stack 205a, 205b may contain by way of a non-limiting example 20-30 active layers. In one non-limiting embodiment of the invention, the element assembly 200 comprises a folded low-density high stiffness magnesium aluminum alloy head mass 210. A tail mass 220 includes a folded high-density tungsten alloy. Tie-rods 215 serve to connect the head mass 210 and the tail mass 220 to contain the stacks 205a, 205b in a rigid assembly under compression. In the embodiment described, electrodes 207a, 207b of like polarity are clad 225 using silver ceramic wiring to effectively connect the elements in each stack 205a, 205b in parallel. The positive electrodes 207a on stack 205a are all electrically joined and the negative electrodes 207b on stack 205a are likewise electrically joined; each of the positive and negative electrodes are electrically isolated from one another. On the rear side of the stacked assembly (not shown) negative electrodes 207b are electrically coupled together for stack 205a and the negative electrodes 207b are likewise electrically coupled to stack 205b; the positive and negative electrodes are also electrically isolated from one another. The stacks' 205a, 205b electrical signals interface through the electrodes 207a, 207b via leads 235 having four conductors that attach clad 225 to an input/output port 240 formed into an isolation layer 237. The transducer element assembly 200 may be fastened to an array or module using array plate fasteners 241 and isolating washer 243.

Figure 3A:
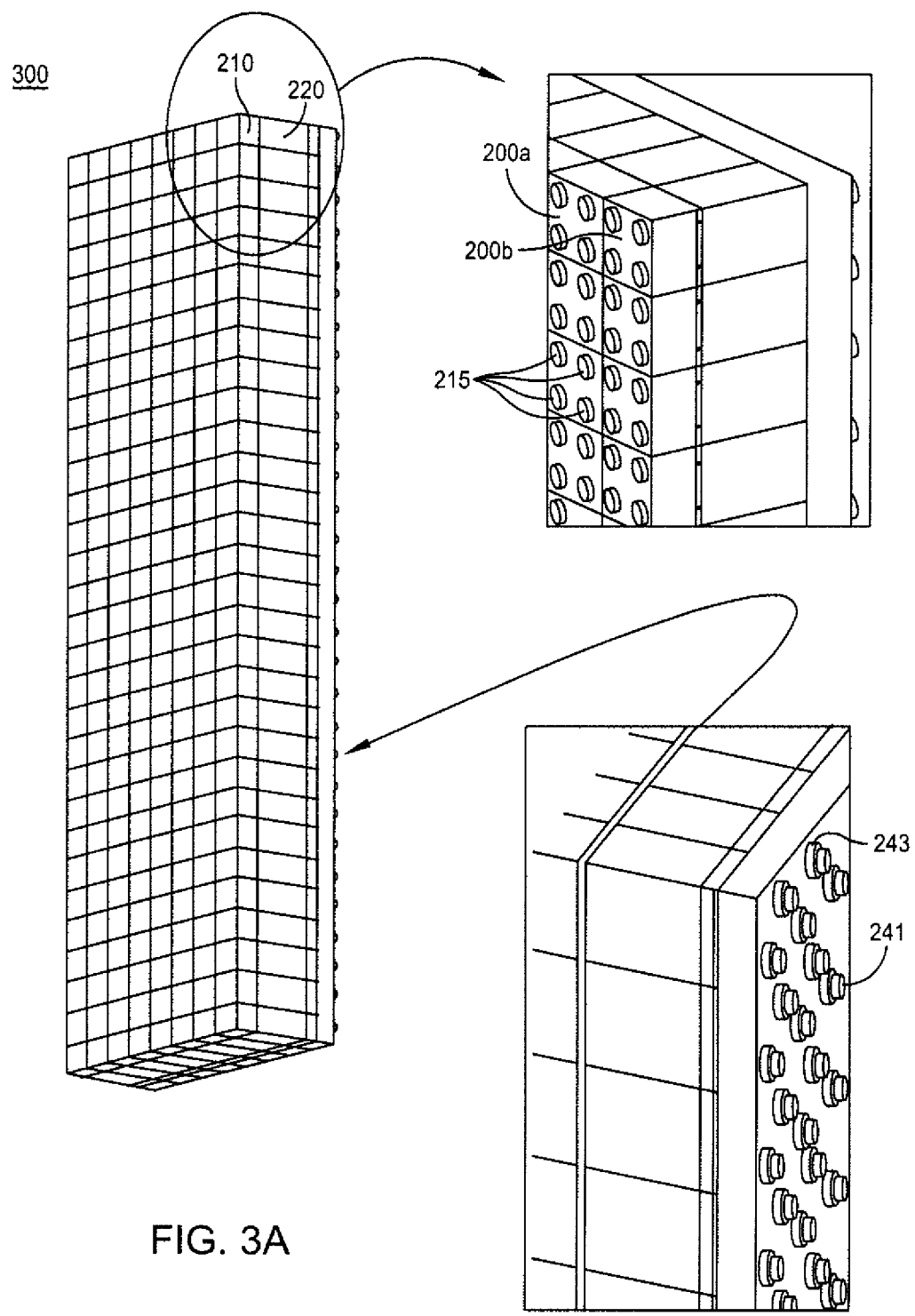
FIG. 3A is an isometric view of a 8×30 element transducer module according to an exemplary embodiment.

FIG. 3A shows a plurality of finished sonar transducer element assemblies 200, such as 200a and 200b assembled into a module 300. Each module 300 may by way of a non-limiting example contain 30 to 36 element assemblies 200 in the vertical direction. FIG. 3A shows module 300 as containing 8 element assemblies 200 in the horizontal direction and 30 element assemblies 200 in the vertical direction. The module 300 contains isolation washers 243 and fasteners 241.

Figure 3B:
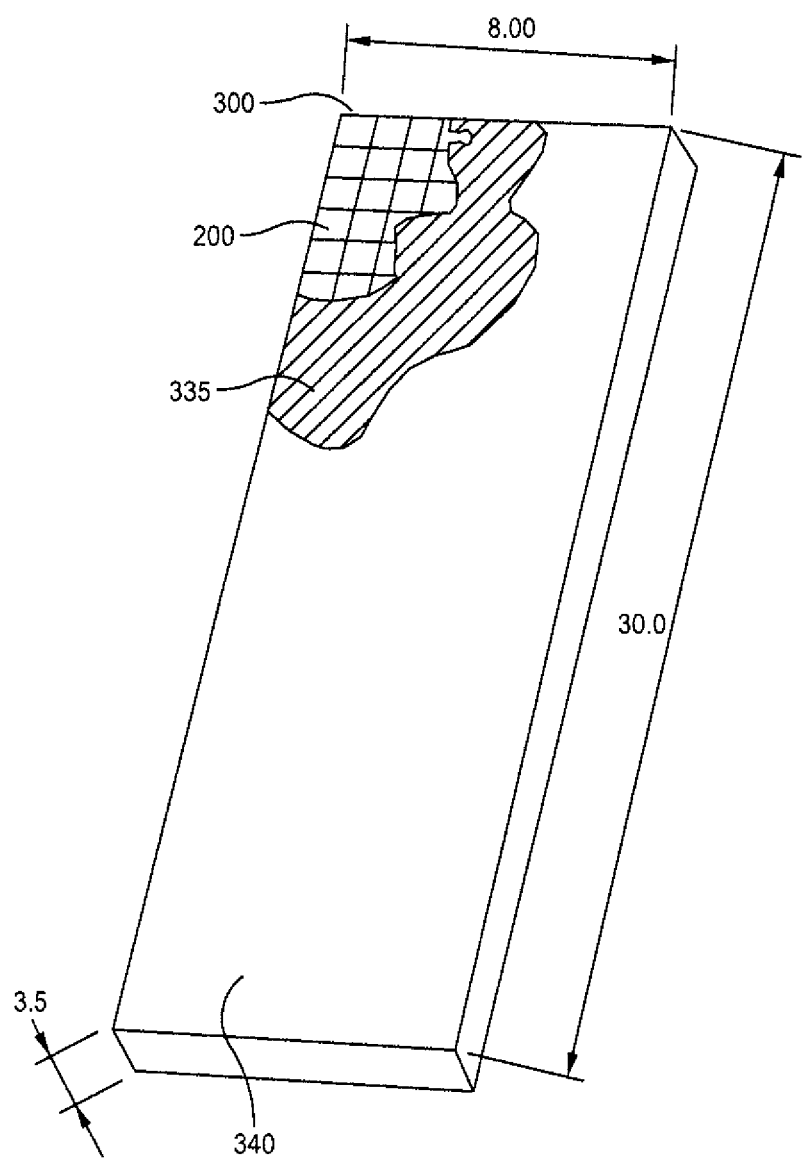
FIG. 3B is an isometric, partial cut away view of an encapsulated 8×30 element transducer module according to an exemplary embodiment.

In the example of FIG. 3B, the module 300 contains 240 tape cast sonar transducer element assemblies 200 arranged as 8 element assemblies in the horizontal direction and 30 element assemblies in the vertical direction. The module 300 measures 30 inches (30 in.) in the vertical direction, 8 inches in the horizontal direction, and 3.5 inches in depth. A titanium moisture barrier 335 covered by a vulcanized rubber seal 340 permits the module 300 to be employed in an underwater application without degrading performance.

The stacks may be assembled into the transducer element assembly 200 as one contiguous stack or a plurality of stacks. The embodiment illustrated in FIG. 2, depicts two stacks 205a and 205b. In a non limiting embodiment illustrated in FIG. 4 a transducer element assembly 400 has a vertical body length of 2.3 inches containing one stack 405 having electrodes 407 with a nominal 50 mil separation. The head mass 415 is composed of magnesium-aluminum alloy having a square top dimension of 0.9×0.9 inches. A tail mass 430 also measures 0.9×0.9, in a square dimension. The stack 405 uses a conductive epoxy to form the positive electrode wire 420 and a conductive epoxy to form a negative electrode wire 435. Two washers 410, 425 electrically isolate the stack 405 from the transducer element assembly 400.

Figure 4:
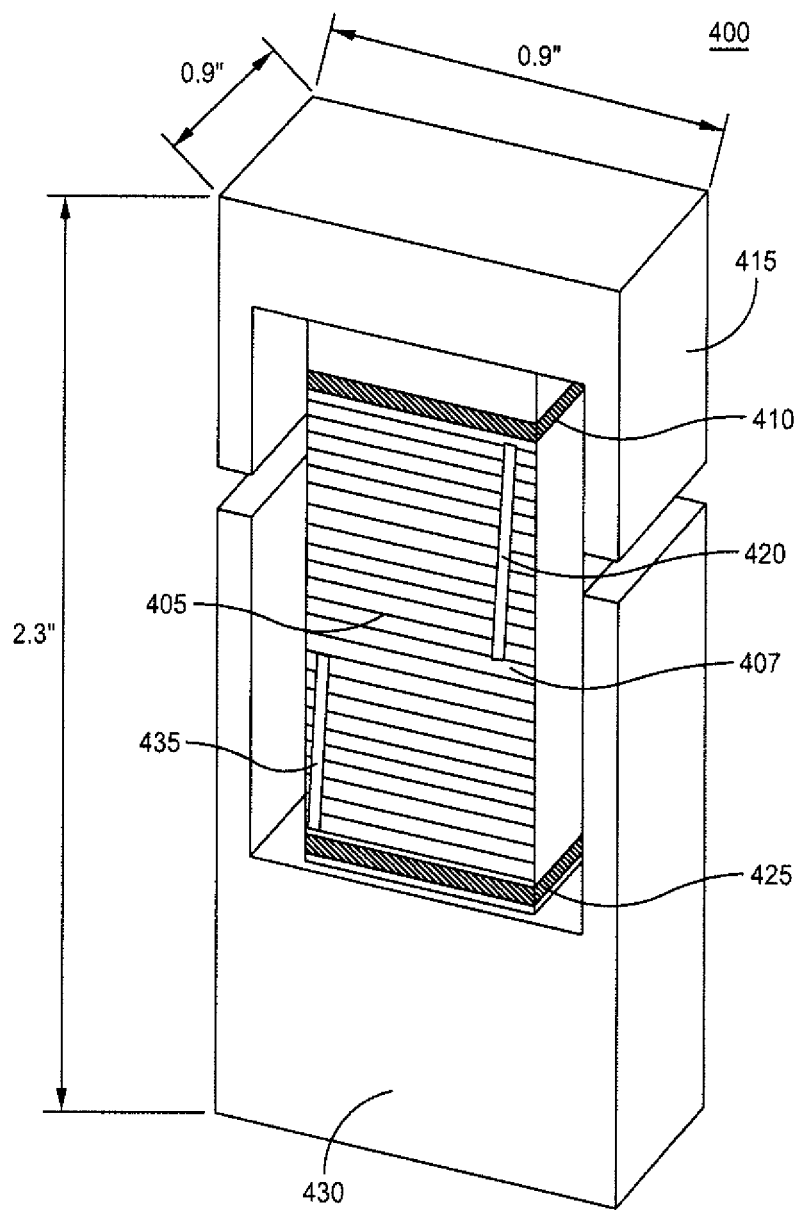
FIG. 4 is an isometric partial cut away view of a single element tape cast transducer assembly according to an exemplary embodiment.
Figure 5:
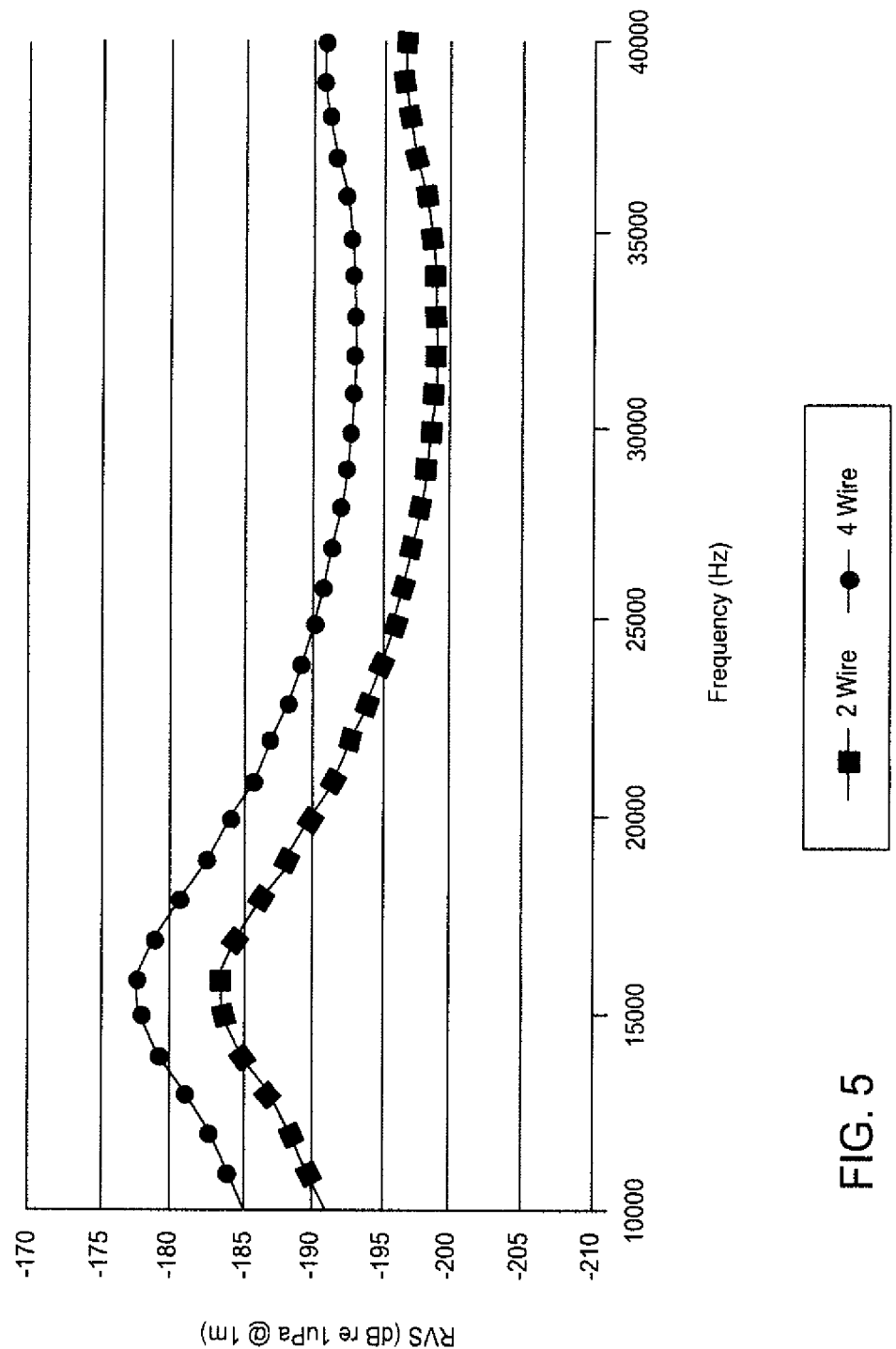
FIG. 5 is a graph showing frequency response from a simulation of two different configurations of a tape cast transducer element according to an exemplary embodiment.

FIG. 5 shows a comparison in the performance between a double stack transducer element assembly as shown in FIG. 2 and a single stack transducer element assembly as for example shown in FIG. 4. As utilized in a transmit mode, the double stacks in FIG. 2 were connected in parallel. In a receive mode the double stacks were connected in a series mode. The graph in FIG. 5 shows the partitioning of the stack into 2 half stacks, referred to as the 4-wire design as having a 6 db improvement over the one stack 2 wire design.

FIG. 6A and FIG. 6B show ships 605a and 605b having conic section surface curvatures 602a and 602b that change continuously over surface 625. Tape cast sonar transducer array formations 610a and 610b, as illustrated, provide a virtually instantaneous scan capability over a maximum 180° azimuth and elevation without degrading inertial effects and without mechanical scan losses. According to an exemplary embodiment, array 610a on the doubly-curved surface 602a continuously changes its radiating and receive element-to-element orientation in two dimensions to maintain conformity. According to another exemplary embodiment, array 610b on the singly curved surface 602b continuously changes its radiating and receive element-to-element orientation in one dimension to maintain conformity. Sonar transducer array formations 610a, 610b may be mounted either internal to the ship surface 605a, 605b respectively, or upon the exterior surface 605a, 605b hull.

The manufacturing and construction costs associated with conformal approaches are generally high, at least in part due to the variable surface curvature that requires the sub-panels constituting an array to conform. However, the encapsulated module illustrated in FIG. 3B would reduce the cost associated with the surface curvature since each module would form a discrete and small chordal section along the curve. The plurality of finished sonar transducer element assemblies 200, such as 200a and 200b assembled into a module 300 are applied end to end such that the module to module linear dimension is relatively small (e.g. approximately one-inch linear dimension for each tape cast sonar transducer element produces a 30 inch by 8 inch module) compared to radius of curvature as of the hull of, for example a Virginia Class Submarine (Length: 377 ft., Beam: 34 ft.) as illustrated by subtended angle 615, thus rendering insignificant any curvature anomaly.

Figure 7:
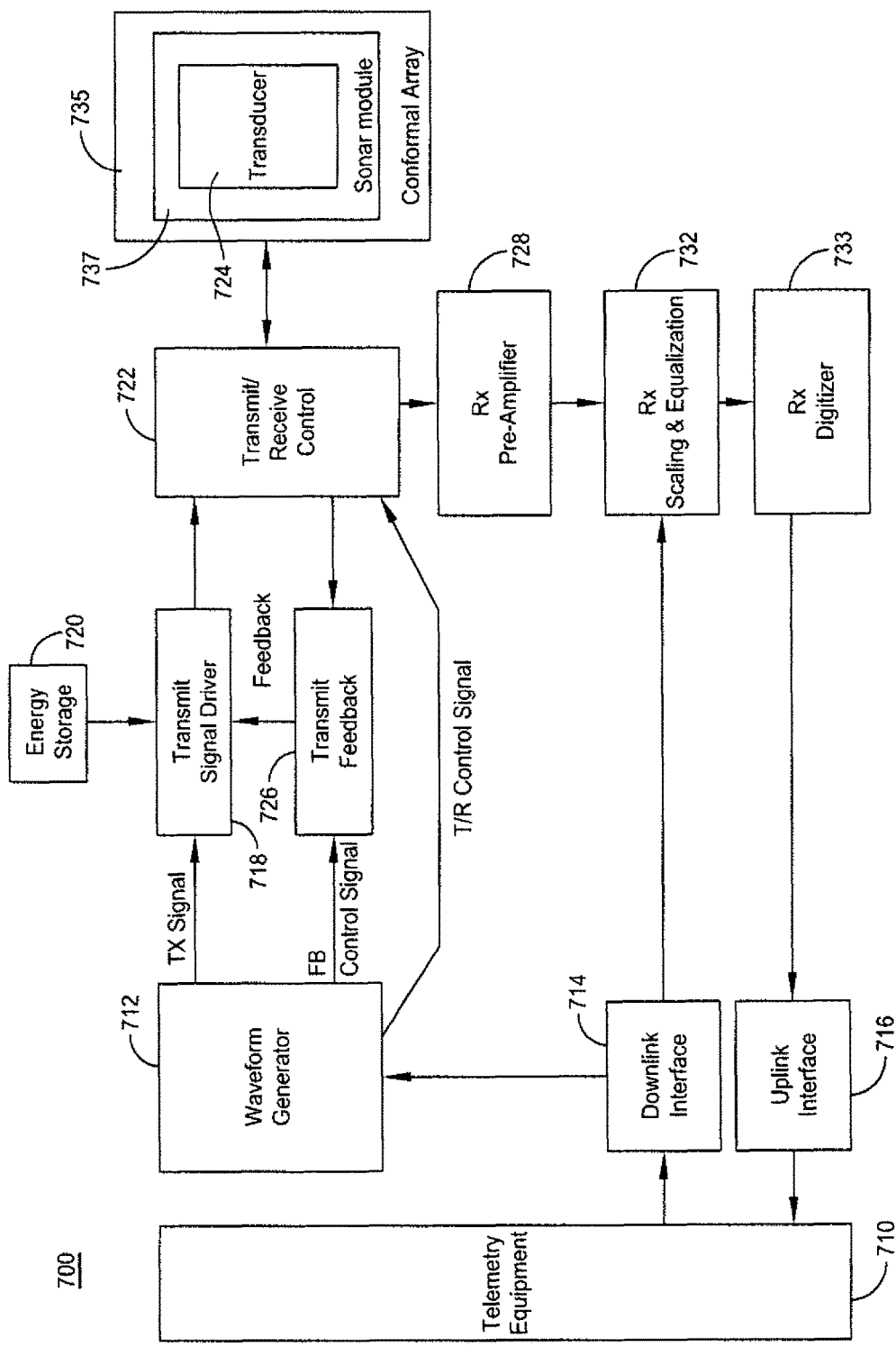
FIG. 7 illustrates a system for transmitting and receiving tape cast transducer signals according to an exemplary embodiment.

FIG. 7 discloses a system 700 that integrates tape cast sonar transducers elements 724 arrayed in a conformal application so as to transmit and receive sonar signals from underwater targets. A tape cast ceramic sonar transducer array 735 conforms to the shape of a ship hull and has multiple tape cast transducer element module panels 737, each capable of operating as an electronically scanned sonar, and each capable of independently forming, steering, and shaping transmit and receive beams. A signal switching distribution network 722 allows transmit power and requisite sonar and control signals to be sent to and received from select transducer elements 724 or subsets of the panels 737. A processor coherently combines the return signals received from selected transducers 724 or subsets of the panels 737 for a wide range of undersea applications. A waveform generator 712 produces stable waveforms with unique frequencies and phase characteristics for each one of the tape cast sonar transducer elements 724. The transmitter signal driver 718 receives its power from energy storage device 720 and outputs a transmit signal to transmit/receive controller 722. Controller 722 serves to switch or direct inputs and outputs from a tape cast sonar transducer element 724 module panel 737 or array 735.

As indicated transmit/receive controller 722 directs the tape cast sonar transducer elements 724 received acoustic signals from the synchronized transmissions produced by transmitter signal driver 718. The return signal also provides data to transmitter feedback conditioning and processing function 726 to adjust the waveform generator output 712 to condition subsequent wave form transmissions.

The receptions from the tape cast sonar transducer elements 724 are processed and uplinked through an uplink interface 716 to telemetry equipment 710. In its broad operational aspect, radio telemetry equipment 710 serves as a communication link between the underwater acoustic transmitting/receiving portion of the system 700 and a remote central station such as a surface ship via a transmission antenna not shown. The telemetry 710 houses a transmission device operably coupled to a transponder system not shown. The telemetry 710 transmission device transmits data received from the transponder system as electromagnetic energy in a particular frequency range exchanging digital control signals between the surface central station and the ship that has thereon installed system 700. Telemetry 710 transmits a received signal digitizer 733 data over the airwaves. In certain applications, the ship-to-telemetry 710 communication downlinks 714 data to serve as a remote control of both telemetry and system 700. In the embodiment shown in FIG. 7 the downlink 714 controls the waveform generator 712 and the receiver scaling and equalization 732.

A digital receive sub system comprised of a preamplifier 728, a scaling and equalization module 732 and the receiver digitizer 733 provides amplification of the sound signal received at each tape cast sonar transducer element of an array as for example described in reference to FIG. 6A, FIG. 6B. The digital receive sub system may also provide for a direct per channel analog-to-digital conversion of the sound signal; a digital memory to provide delays for focusing; and digital summation of the focused signals from all the channels. Other processing features of the digital receive system include phase rotation of a receive signal on a channel-by-channel basis to provide fine focusing, amplitude scaling (apodization) to control the beam sidelobes, and digital filtering to control the bandwidth of the signal.

Figure 8:
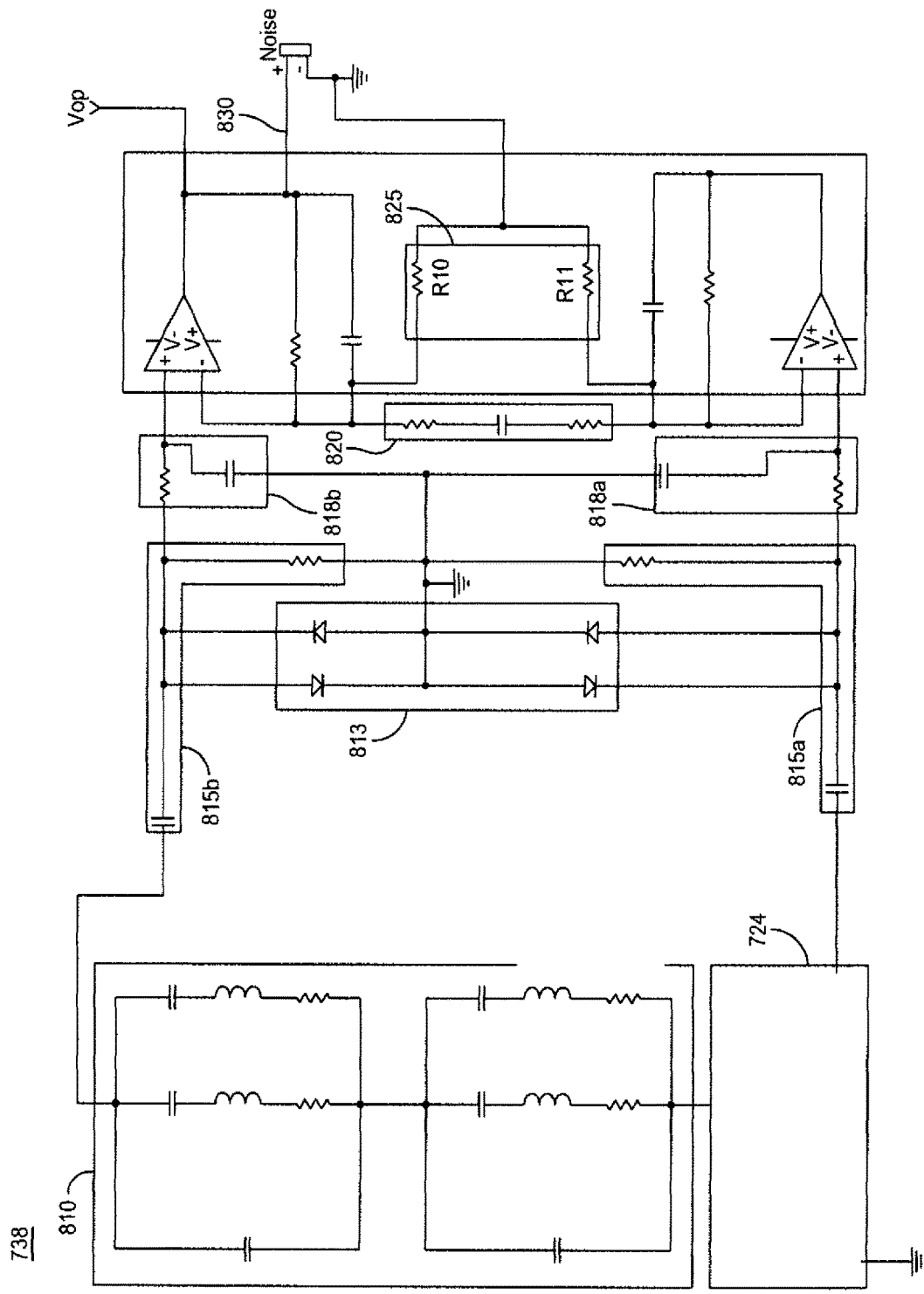
FIG. 8 illustrates a circuit for receiving tape cast transducer signals according to an exemplary embodiment.

FIG. 8 shows a pre amplifier circuit 738 that serves to receive the sonar transducer tape cast sonar transducer elements 724. The preamplifier tracks DC voltage changes out of the transducer over a specified rate of ascend and descend. Two series half stack receive networks 810 are tuned to receive a bipolar signal (e.g. 482 Hz transducer signal) for low noise amplification. A high pass filter having a 6 db break point corresponding to the signal (e.g. a break point of 482 Hz) is provided by RC network 815a, 815b. Diodes 813 serve to provide differential and common mode over voltage protection. Low pass RC network 818a, 818b protect against RF rectification by filtering correlated noise. RC network 820 serves as an equalizer to balance the inputs to output linear amplifying system 830. Resistors network 825 comprised of resistors R10 and R11 provide a differential calibration input.

Figure 9:
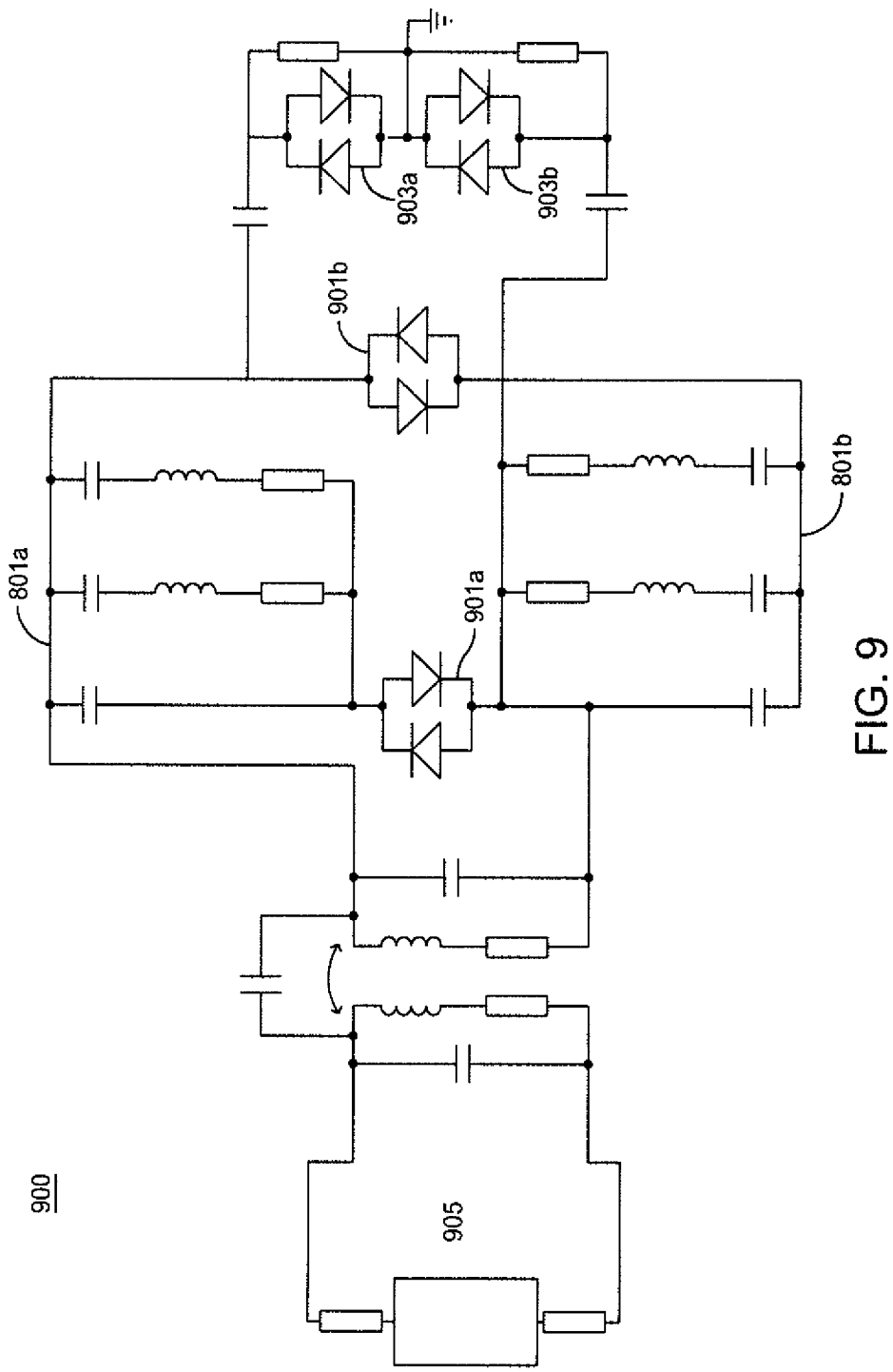
FIG. 9 illustrates a circuit for transmitting tape cast transducer signals according to an exemplary embodiment.

FIG. 9 illustrates an exemplary embodiment of a circuit for transmitting a tape cast transducer signal. The embodiment of transmitter 900 uses diodes to provide load compensation and load switching between transmit and receive operational modes. A tape cast multi-layer transducer element comprises an element driver having two piezoelectric half stacks 801*a* and 801*b* coupled by diode arrangements 901*a* and 901*b*. Diode arrangements 901*a*, 901*b* compensate for load imbalances between the two half stacks 901*a*, 901*b*. Diode arrangements 903*a* and 903*b* are also coupled between half stacks 801*a*, 801*b* to provide switching capability between transmit and receive modes for half stacks 801*a* and 801*b*, respectively. Diodes 903*a* are configured in opposite polarities such that biasing diodes 903*a* cause the circuit flow to proceed through diode 903*a* in a direction dictated by the biasing voltage. Diodes 903*b* operate in a similar manner with respect to circuit flow control for half stack 801*b*. The transmitter 900 is powered by a voltage controlled voltage source 905.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A tape cast transducer element assembly comprising:
   a tape cast transducer element comprising:
      a multi-layer piezoelectric stack diced from a sintered piezoelectric body formed from a plurality of thin film tape layers, the film thin tape layers sintered to produce a final density;
      a conductive film coating select ones of the thin film tape layers such that conductive layers of different polarities are exposed on opposing sides of the multi-layer piezoelectric stack;
      a plurality of electrodes coupled to said conductive layers;
      a plurality of electrical leads coupled to each electrode;
   a head mass configured to encapsulate a top portion of said stack;
   a tail mass configured to encapsulate a bottom portion of said stack; and
   at least one coupling arrangement extending from a top surface of said head mass through the cross-sectional area of said head mass into said tail mass, such that said stack is contained in a rigid assembly under compression.

2. The tape cast transducer element assembly of claim 1, wherein a conductive cladding is coupled to said plurality of electrodes according to polarity, such that electrodes having a same desired electrode polarity are electrically connected in parallel by said cladding.

3. The tape cast transducer element assembly of claim 2, wherein said cladding comprises silver ceramic.

4. The tape cast transducer element assembly of claim 1, wherein said head mass comprises a low density, high stiffness material for enhancing electroacoustic coupling and bandwidth range.

5. The tape cast transducer element assembly of claim 4, wherein said head mass low density high stiffness material comprises a folded low density magnesium aluminum alloy.

6. The tape cast transducer element assembly of claim 1, wherein said tail mass comprises a high density material for enhancing electroacoustic coupling, bandwidth range, and transducer element miniaturization.

7. The tape cast transducer element assembly of claim 6, wherein said tail mass high density material comprises a folded high-density tungsten alloy.

8. The tape cast transducer element assembly of claim 1, wherein said tape cast transducer element comprises a plurality of said multi-layer piezoelectric stacks configured in a vertical arrangement and separated from one another by an insulating layer.

9. The tape cast transducer element assembly of claim 8, wherein the number of multi-layer piezoelectric stacks for each said tape cast transducer element is two, and wherein a first positive electrode is disposed on a first one of said two multi-layer piezoelectric stacks; a second positive electrode is disposed on a second one of said two multi-layer piezoelectric stacks; a first negative electrode is disposed on said first one of said two multi-layer piezoelectric stacks; and a second negative electrode is disposed on said second one of said two multi-layer piezoelectric stacks; and wherein said first and said second positive electrodes are electrically connected in parallel to one another and said first and second negative electrodes are electrically connected in parallel to one another.

10. The tape cast transducer element assembly of claim 9, wherein respective positive and negative electrodes of each of said two multi-layer piezoelectric stacks are electrically isolated from one another.

11. The tape cast transducer element assembly of claim 9, wherein said two multi-layer piezoelectric stacks define a half stack configuration, each half stack comprising two sets of conductive lead wires.

12. The tape cast transducer element assembly of claim 1, wherein the at least one coupling arrangement comprises a tie rod extending from the top surface of said head mass through the cross-sectional area of said head mass into said tail mass, such that said stack is contained in said rigid assembly under compression.

13. A tape cast transducer element comprising:
   a piezoelectric body configured as a multi-layer stack including a plurality of thin film tape layers, wherein conductive layers of different polarities are disposed between select ones of said plurality of thin film tape film layers, wherein said thin film tape layers and said conductive layers are sintered and diced to form said piezoelectric body;

a first conductive electrode having a first polarity electrically connecting said conductive layers of a first polarity on a first surface of said piezoelectric body;

a second conductive electrode having a second polarity electrically connecting said conductive layers of a second polarity on a second surface of said piezoelectric body, opposing said first surface;

a conductive silver ceramic cladding coating said first conductive electrode and said second conductive electrode;

a first conductive lead electrically connected to said first conductive electrode; and a second conductive lead electrically connected to said second conductive electrode, wherein said piezoelectric body defines:

a first multi-layer piezoelectric stack, said first conductive electrode connecting conductive layers on a first surface of said first multi-layer piezoelectric stack and said second conductive electrode connecting conductive layers on a second surface of said first multi-layer piezoelectric stack;

a second multi-layer piezoelectric stack, wherein a third conductive electrode connects conductive layers on a first surface of said second multi-layer piezoelectric stack, a fourth conductive electrode connects conductive layers on a second surface of said second multi-layer piezoelectric stack; and an insulating layer separating said first multi-layer piezoelectric stack and said second multi-layer piezoelectric stack, wherein said first and said third conductive electrodes have a like polarity and said second and said fourth conductive electrodes have a like polarity, and wherein said first and third conductive electrodes are electrically connected in parallel when utilized in a transmit mode, and electrically connected in series when utilized in a receive mode, and said second and fourth conductive electrodes are electrically connected in parallel when utilized in a transmit mode, and electrically connected in series when utilized in a receive mode.

14. The tape cast transducer element of claim 13, wherein said first conductive electrode has a positive polarity and said second conductive electrode has a negative polarity, and wherein said first conductive electrode and said second conductive electrode are electrically isolated from one another.

15. The tape cast transducer element of claim 13, wherein said cladding comprises silver ceramic.

16. The tape cast transducer element of claim 13, wherein said first conductive electrode and said second conductive electrode each comprise a conductive epoxy.

17. The tape cast transducer element of claim 13, further comprising:

a first dielectric washer at a proximal end of said piezoelectric body; and a second dielectric washer at a distal end of said piezoelectric body, said first and second dielectric washer adapted to electrically isolate said tape cast transducer element from a tape cast transducer element assembly adapted to contain said tape cast transducer element.

18. The tape cast transducer element of claim 13, wherein each of said first and second multi-layer piezoelectric stacks comprises about 20 to about 30 layers of thin film tape.

19. The tape cast transducer element of claim 13, further comprising a plurality of diode arrangements coupled between the first multi-layer piezoelectric stack and the second multi-layer piezoelectric stack and configured to provide switching between the transmit and receive modes.

20. A tape cast transducer element comprising:

a piezoelectric body configured as a multi-layer stack including a plurality of thin film tape layers, wherein conductive layers of different polarities are disposed between select ones of said plurality of thin film tape film layers, wherein said thin film tape layers and said conductive layers are sintered and diced to form said piezoelectric body;

a first conductive electrode having a first polarity electrically connecting said conductive layers of a first polarity on a first surface of said piezoelectric body;

a second conductive electrode having a second polarity electrically connecting said conductive layers of a second polarity on a second surface of said piezoelectric body, opposing said first surface;

a conductive silver ceramic cladding coating said first conductive electrode and said second conductive electrode;

a first conductive lead electrically connected to said first conductive electrode; and a second conductive lead electrically connected to said second conductive electrode.

* * * * *